(12) United States Patent
Park et al.

(10) Patent No.: US 9,691,345 B2
(45) Date of Patent: Jun. 27, 2017

(54) DUAL-DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Jin-Oh Park, Yongin (KR); Dong-Wan Choi, Yogin (KR); Hyo-Sang Yang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 465 days.

(21) Appl. No.: 13/752,067

(22) Filed: Jan. 28, 2013

(65) Prior Publication Data

US 2014/0049449 A1 Feb. 20, 2014

(30) Foreign Application Priority Data

Aug. 20, 2012 (KR) .......................... 10-2012-0090902

(51) Int. Cl.
*G09G 5/00* (2006.01)
*G09G 3/20* (2006.01)
(Continued)

(52) U.S. Cl.
CPC ................. *G09G 5/00* (2013.01); *G09G 3/20* (2013.01); *H01L 27/3244* (2013.01);
(Continued)

(58) Field of Classification Search
CPC .......................... G09G 2380/02; H01L 27/3267
(Continued)

(56) References Cited

U.S. PATENT DOCUMENTS 6,501,528 B1 * 12/2002 Hamada ............ G02F 1/133305
345/4
7,777,856 B2 8/2010 Silverbrook
(Continued)

FOREIGN PATENT DOCUMENTS

KR 10-2001-0077355 A 8/2001
KR 10-2007-0043255 A 4/2007
(Continued)

*Primary Examiner* — Michael Faragalla
*Assistant Examiner* — Chayce Bibbee
(74) *Attorney, Agent, or Firm* — Knobbe Martens Olson & Bear LLP

(57) ABSTRACT

A dual-display device includes a flexible substrate comprising first and second surfaces opposing each other, the first surface comprising a first area and a second area, the flexible substrate being bent to allow the first and second areas of the first surface to face each other, the second surface comprising first and second areas opposing the first and second areas of the first surface, respectively. The device further includes a first display unit formed over the first area of the second surface of the bent flexible substrate, and realizing an image; a second display unit formed over second area that is opposite to the first area of the second surface of the bent flexible substrate, electrically connected to the first display unit via lines, and realizing another image; and a common driver unit electrically connected to a pad area that extends from the first display unit, and configured to transmit at least a signal to drive the first display unit and the second display unit.

22 Claims, 11 Drawing Sheets

(51) Int. Cl.
 *H01L 27/32* (2006.01)
 *G09G 3/3225* (2016.01)
(52) U.S. Cl.
 CPC ....... *H01L 27/3267* (2013.01); *G09G 3/3225* (2013.01); *G09G 2300/023* (2013.01); *G09G 2300/0426* (2013.01); *G09G 2310/0281* (2013.01); *G09G 2310/0297* (2013.01); *G09G 2360/04* (2013.01); *G09G 2380/02* (2013.01); *H01L 2251/533* (2013.01); *Y10T 29/49146* (2015.01)
(58) Field of Classification Search
 USPC .......................................................... 345/1.3
 See application file for complete search history.

(56) References Cited

U.S. PATENT DOCUMENTS

| | | | |
|---|---|---|---|
| 2004/0207569 A1* | 10/2004 | Ho et al. .................... | 345/1.1 |
| 2007/0035473 A1* | 2/2007 | Yamazaki ........... | G02F 1/13318 |
| | | | 345/4 |
| 2010/0277855 A1 | 11/2010 | Lim et al. | |
| 2012/0204453 A1 | 8/2012 | Jung | |

FOREIGN PATENT DOCUMENTS

| | | |
|---|---|---|
| KR | 10-1065315 B1 | 9/2011 |
| KR | 10-2012-0093665 A | 8/2012 |

* cited by examiner

DUAL-DISPLAY DEVICE AND METHOD OF MANUFACTURING THE SAME

CROSS-REFERENCE TO RELATED PATENT APPLICATION

This application claims the benefit of Korean Patent Application No. 10-2012-0090902, filed on Aug. 20, 2012, in the Korean Intellectual Property Office, the disclosure of which is incorporated herein in its entirety by reference.

BACKGROUND

1. Field

The present disclosure relates to a dual-display device that realizes an image on its dual screens.

2. Description of the Related Art

Recently, a display field with respect to visual realization of an electrical information signal has been rapidly developing, and in this regard, various flat display devices that are slim and light-weight and that require low power consumption have been developed to correspond to the rapid development.

Examples of the flat display device may include a liquid crystal display device (LCD), an organic light-emitting display device, an electrophoretic display (EPD), an electric paper display (EPD), a plasma display panel device (PDP device), a field emission display device (FED device), an electro luminescence display device (ELD device), an electro-wetting display (EWD), and the like. The aforementioned examples commonly require a flat display panel as a necessary element to realize an image.

The flat display device has a slim thickness and requires low power consumption, so that the flat display device may be manufactured as a dual-display device capable of displaying an image on its dual screens. In particular, since electronic devices are designed with various shapes, display portions of the electronic devices are designed as folder-type electronic devices that have an external window and an internal window and thus display an image on their dual windows. In this regard, many researches actively conduct to manufacture a dual-display device that is easily manufactured, has an increased yield rate, and has excellent slimness.

SUMMARY

An aspect of the present invention provides a dual-display device with a thin thickness which is manufactured via a simple manufacturing process, and a method of manufacturing the dual-display device.

Another aspect of the present invention provides a dual-display device including a flexible substrate comprising first and second surfaces opposing each other, the first surface comprising a first area and a second area, the flexible substrate being bent to allow the first and second areas of the first surface to face each other, the second surface comprising first and second areas opposing the first and second areas of the first surface, respectively; a first display unit formed over the first area of the second surface of the bent flexible substrate, and realizing a first image; a second display unit formed over the second area of the second surface that is opposite to the first area of the second surface of the bent flexible substrate, electrically connected to the first display unit via lines, and realizing a second image; and a common driving unit electrically connected to a pad area that extends from the first display unit, and applying at least a signal to drive the first display unit and the second display unit. The first and second images can be the same image or can be different from each other.

The lines may be disposed over a third area of the second surface between the first area and the second area of the second surface of the flexible substrate, and the third area may include a bending area.

The dual-display device may further include a protective layer formed over the third area so as to cover the lines.

The dual-display device may further include a first driving unit disposed over the first area of the second surface, electrically connected to the first display unit, and applying at least a signal to drive the first display unit; and a second driving unit disposed over the second area, electrically connected to the second display unit, and applying at least a signal to drive the second display unit, wherein the first driving unit and the second driving unit may be electrically connected to each other via the lines that are disposed over the third area.

The dual-display device may further include a first encapsulation unit arranged over the first display unit, and encapsulating the first display unit; and a second encapsulation unit arranged over the second display unit, and encapsulating the second display unit.

The first encapsulation unit or the second encapsulation unit may extend to the third area so as to cover the lines.

The dual-display device may further include a first optical film disposed on the first encapsulation unit; and a second optical film disposed on the second encapsulation unit.

Each of the first display unit and the second display unit may include at least one thin-film transistor (TFT) and an organic light-emitting device coupled to the at least one TFT, and the lines may be coupled to the at least one TFT or the organic light-emitting device.

The first display unit and the second display unit may realize an image in a direction away from the flexible substrate.

The dual-display device may further include an adhesive layer disposed between the first and second areas of the first surface of the bent flexible substrate and adhering or bonding the first and second areas of the surface of the flexible substrate.

Still another aspect of the present invention provides a dual-display device including a flexible substrate comprising first and second surfaces opposing each other, the first surface comprising a first area and a second area, the flexible substrate being bent to allow the first and second areas of the first surface to face each other, the second surface comprising first and second areas opposing the first and second areas of the first surface, respectively; a first display unit formed over the first area of the first surface of the bent flexible substrate, and realizing an image; a second display unit formed over the second area of the first surface that faces the first area of the first surface of the bent flexible substrate, electrically connected to the first display unit via lines, and realizing another image; and a common driving unit electrically connected to a pad area that extends from the first display unit, and applying at least a signal to drive the first display unit and the second display unit.

The lines may be disposed over a third area of the first surface between the first area and the second area of the first surface of the flexible substrate, and the third area may include a bending area.

The dual-display device may further include a first driving unit disposed over the first area of the first surface, electrically connected to the first display unit, and applying at least a signal to drive the first display unit; and a second driving unit disposed over the second area of the first surface, electrically connected to the second display unit, and applying at least a signal to drive the second display unit, wherein the first driving unit and the second driving unit may be electrically connected to each other via the lines that are disposed over the third area.

The dual-display device may further include a first encapsulation unit arranged over the first display unit, and encapsulating the first display unit; and a second encapsulation unit arranged over the second display unit, and encapsulating the second display unit.

The dual-display device may further include an adhesive layer disposed between the first and second encapsulation units and adhering or bonding the first encapsulation unit and the second encapsulation unit.

The dual-display device may further include a first optical film disposed over the first area of the second surface of the flexible substrate; and a second optical film disposed over the second area of the other surface of the flexible substrate.

Each of the first display unit and the second display unit may include at least one thin-film transistor (TFT) and an organic light-emitting device coupled to the at least one TFT, and the lines may be coupled to the at least one TFT or the organic light-emitting device.

The first display unit and the second display unit may realize an image toward the flexible substrate.

A further aspect of the present invention provides a method of manufacturing a dual-display device, the method including providing a flexible substrate comprising first and second surfaces opposing each other, the first surface comprising a first area and a second area, the second surface comprising first and second areas opposing the first and second areas of the first surface, respectively; forming a first display unit over the first area of the second surface of a flexible substrate, a second display unit over the second area of the second surface, forming lines over a third area of the second surface between the first area and the second area of the second surface, and a pad area that extends from the first display unit; forming a first encapsulation unit over the first display unit, and a second encapsulation unit over the second display unit; connecting a common driving unit with the pad area that extends from the first display unit; and bending the flexible substrate at the third area of the flexible substrate so as to allow the first and second areas of the first surface of the flexible substrate to face each other, and adhering the first and second areas of the first surface of the flexible substrate.

After the operation of forming the lines, the method may further include an operation of forming a protective layer over the third area so as to cover the lines.

In the operation of forming the first and second encapsulation units, the first encapsulation unit or the second display unit may extend over the third area so as to cover the lines.

After the operation of forming the first and second encapsulation units, the method may further include an operation of forming a first optical film over the first encapsulation unit and forming a second optical film over the second encapsulation unit.

Still a further aspect of the present invention provides a method of manufacturing a dual-display device, the method including providing a flexible substrate comprising first and second surfaces opposing each other, the first surface comprising a first area and a second area, the second surface comprising first and second areas opposing the first and second areas of the first surface, respectively; forming a first display unit over the first area of the first surface of a flexible substrate, a second display unit over the second area of the first surface, lines over a third area of the first surface between the first area and the second area of the first surface, and a pad area that extends from the first display unit; forming a first encapsulation unit over the first display unit, and a second encapsulation unit over the second display unit; connecting a common driving unit with the pad area that extends from the first display unit; and bending the flexible substrate at the third area of the flexible substrate so as to allow the first and second areas of the first surface of the flexible substrate to face each other, and adhering the first encapsulation unit and second encapsulation unit.

After the operation of forming the first and second encapsulation units, the method may further include an operation of forming a first optical film over the first area of the second surface of the flexible substrate, and forming a second optical film over the second area of the second surface of the flexible substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Figure 1:
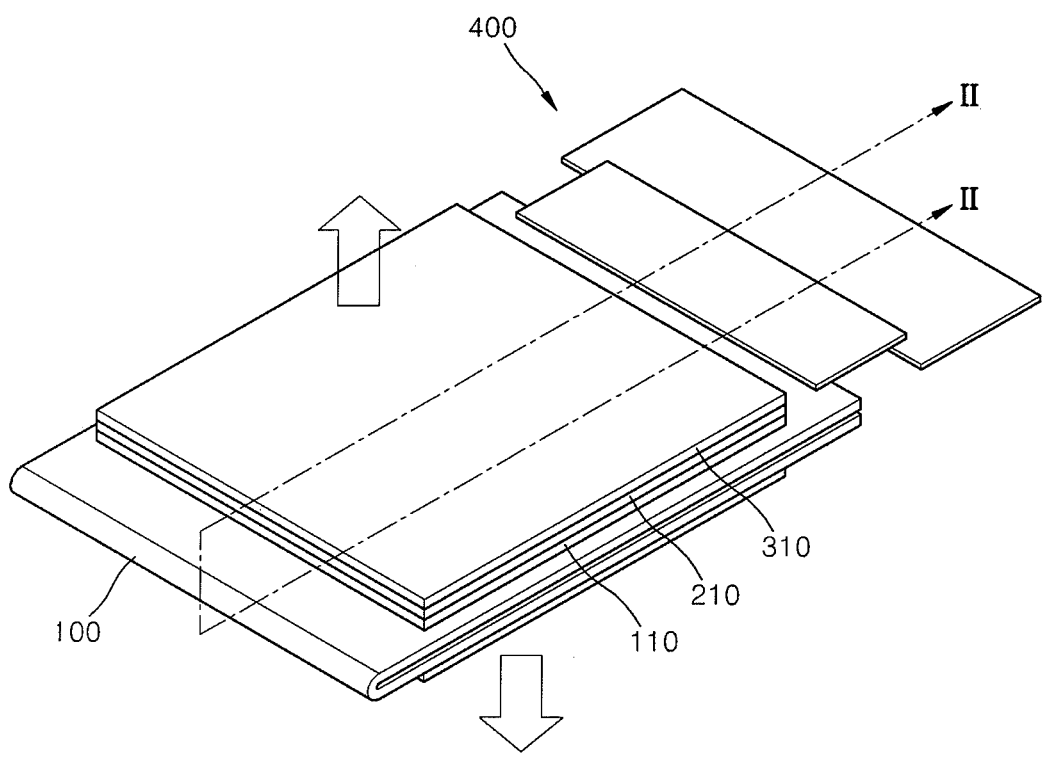
FIG. 1 is a perspective view of a dual-display device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will also be understood that when one element is referred to as being "connected to", or "coupled to" another element, the one element may be directly connected to or coupled to the other element, or an intervening third element may also be present.

However, when one element is referred to as being "directly connected to", or "directly coupled to" another element, an intervening third element may not be present. Like reference numerals in the drawings denote like elements. As used herein, the term "and/or" includes any and all combinations of one or more of the associated listed items.

Hereinafter, embodiments of the present invention will be described in detail with reference to the attached drawings.

Figure 2:
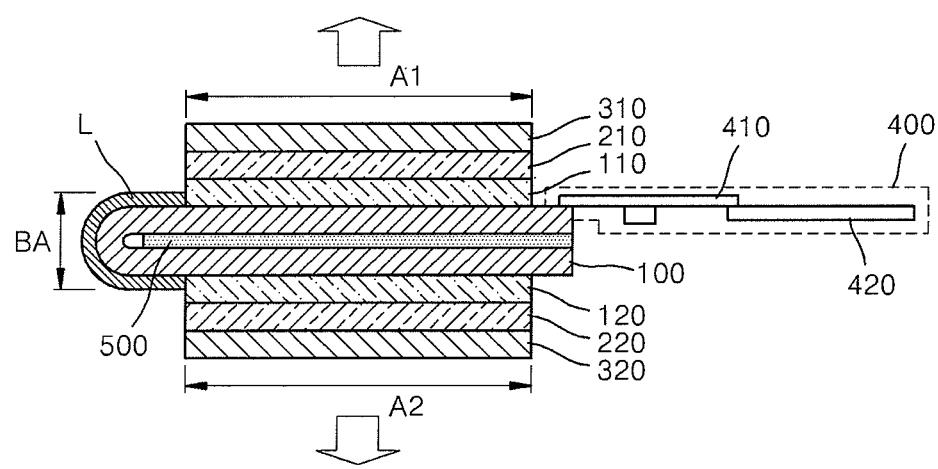
FIG. 2 is a cross-sectional view of the dual-display device of FIG. 1, taken along line II-II.

FIG. 1 is a perspective view of a dual-display device according to an embodiment of the present invention. FIG. 2 is a cross-sectional view of the dual-display device of FIG. 1, taken along line II-II.

In the drawings, thicknesses of layers and regions are exaggerated for clarity. Also, for convenience of description, thicknesses of some of layers and regions are exaggerated. Throughout the specification, it will also be understood that when an element such as layer, region, or substrate is referred to as being "on" another element, it can be directly on the other element, or intervening elements may also be present.

Referring to FIGS. 1 and 2, the dual-display device according to the present embodiment includes a flexible substrate 100 that is bent to allow two sections of a first one of its major surfaces to face each other, a first display unit 110 and a second display unit 120 which are formed on a second one of the major surfaces of the flexible substrate 100 so as to realize an image on dual screens of the dual-display device, and a first encapsulation unit 210 and a second encapsulation unit 220 which encapsulate the first display unit 110 and the second display unit 120, respectively. A first optical film 310 and a second optical film 320 may be further formed on the first encapsulation unit 210 and the second encapsulation unit 220, respectively. The first display unit 110 and the second display unit 120 are connected to each other by using lines L that are formed on the flexible substrate 100, and a common driving unit 400 is connected to a pad area PA (refer to FIG. 3) that is electrically connected to the first display unit 110.

In the present embodiment, the flexible substrate 100 may collectively indicate all types of flexible substrates, and various electronic devices and the lines L may be formed on the flexible substrate 100. Since the flexible substrate 100 has flexibility, although the flexible substrate 100 is bent or folded in a manner shown in FIGS. 1 and 2, the flexible substrate 100 is not damaged. The two areas of the first surface of the flexible substrate 100 which faces each other when the substrate is bent or folded and are adhered to maintain the bent or folded state of the substrate. The first display unit 110 and the second display unit 120 are formed on the second surface of the flexible substrate 100, and the flexible substrate 100 is bent in such a manner that bottom surfaces of the first display unit 110 and the second display unit 120 oppose each other.

The first display unit 110 and the second display unit 120 may include organic light-emitting devices and may be top emission type organic light-emitting display apparatuses that emit light toward the first encapsulation unit 210 and the second encapsulation unit 220 which are formed on front surfaces of the first display unit 110 and the second display unit 120. However, aspects of the present invention are not limited thereto, and thus the first display unit 110 and the second display unit 120 may include inorganic light-emitting devices or field emission displays (FEDs), or alternatively, the first display unit 110 and the second display unit 120 may include different light-emission devices.

Since the organic light-emitting devices that are included in the first display unit 110 and the second display unit 120 easily deteriorate, the first encapsulation unit 210 and the second encapsulation unit 220 are arranged to encapsulate and to protect the organic light-emitting devices. The first encapsulation unit 210 and the second encapsulation unit 220 may be thin-film encapsulation units (TFE units) in which a plurality of organic layers and a plurality of inorganic layers are alternately formed. In the dual-display device according to the present embodiment, a substrate is formed as the flexible substrate 100, and an encapsulation unit is formed as the TFE units, so that flexibility and slimness of the dual-display device may be easily achieved.

The first optical film 310 and a second optical film 320 may be further formed on the first encapsulation unit 210 and the second encapsulation unit 220, respectively, so as to improve a contrast by blocking reflection of external light. Here, the first optical film 310 and the second optical film 320 may include polarizers. The external light that is incident from an external source may be reflected to a user from each layer of the first encapsulation unit 210 or the second encapsulation unit 220, or from an electrode of the first display unit 110 or the second display unit 120, such that the external light may decrease the contrast of the dual-display device. In order to prevent the decrease, the first optical film 310 and a second optical film 320 are formed.

The dual-display device according to the present embodiment includes the common driving unit 400 with respect to the first display unit 110 and the second display unit 120. In more detail, the common driving unit 400 is connected to the pad area PA that is connected to the first display unit 110 via the lines L of a first area A1. The common driving unit 400 applies or transmits various control signals, data signals, and a power voltage, which are required to drive the first display unit 110 and the second display unit 120, to the first display unit 110. The control and data signals are also applied or transmitted to the second display unit 120 via lines L of a bending area BA which electrically connect the first display unit 110 and the second display unit 120. Signals that are applied to the first display unit 110 and the second display unit 120, e.g., the control and data signals may be the same, and in this case, the same image is realized on the first display unit 110 and the second display unit 120. However, aspects of the present invention are not limited thereto, and thus control and data signals that are applied to the first display unit 110 may differ from control and data signals that are applied to the second display unit 120, so that different images may be displayed. A method of driving the first display unit 110 and the second display unit 120 by using the common driving unit 400 is a well known technology in the art and thus detailed descriptions thereof are omitted here.

In the present embodiment, two display units are simultaneously formed on one flexible substrate 100, so that a manufacturing procedure is simplified, compared to a conventional manufacturing procedure in which two display units are formed on two substrates, respectively. Also, since one common driving unit is arranged with respect to the two display units, the manufacturing procedure is simplified, compared to the conventional manufacturing procedure in which two driving units are formed on two display units, respectively. In addition, the present embodiment is characterized in that the slim dual-display device is realized by bending or folding one flexible substrate 100.

Figure 3:
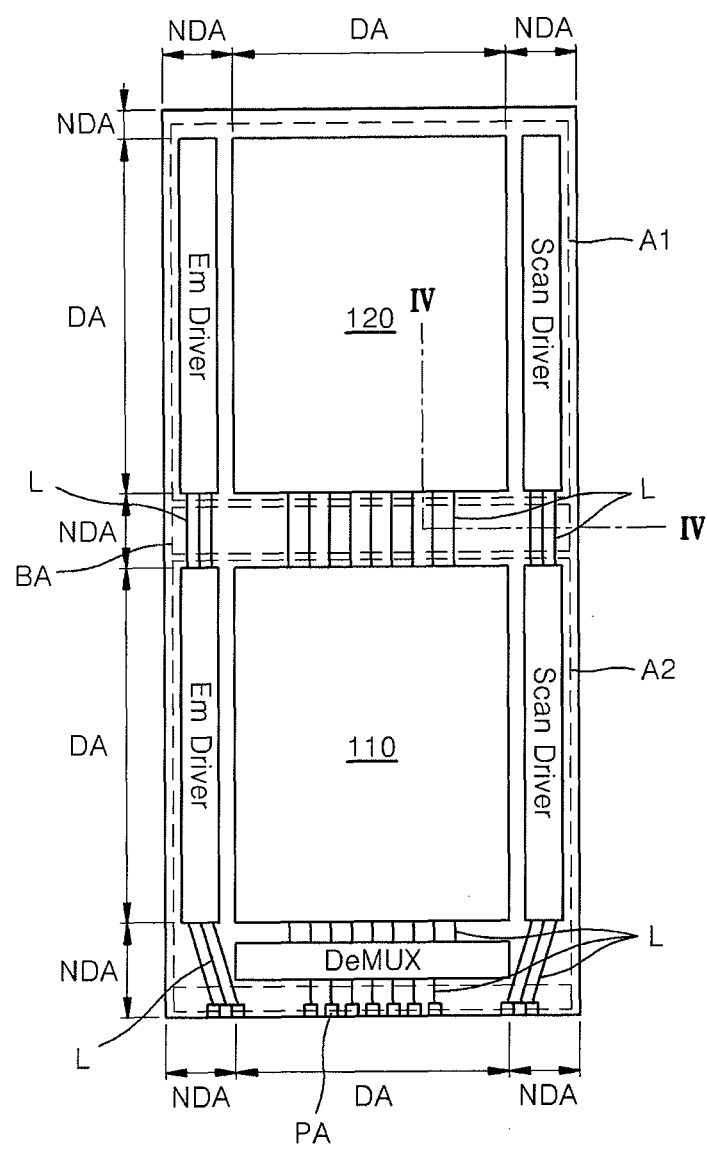
FIG. 3 is a plane view illustrating a method of manufacturing the dual-display device of FIG. 1, according to an embodiment of the present invention.
Figure 4:
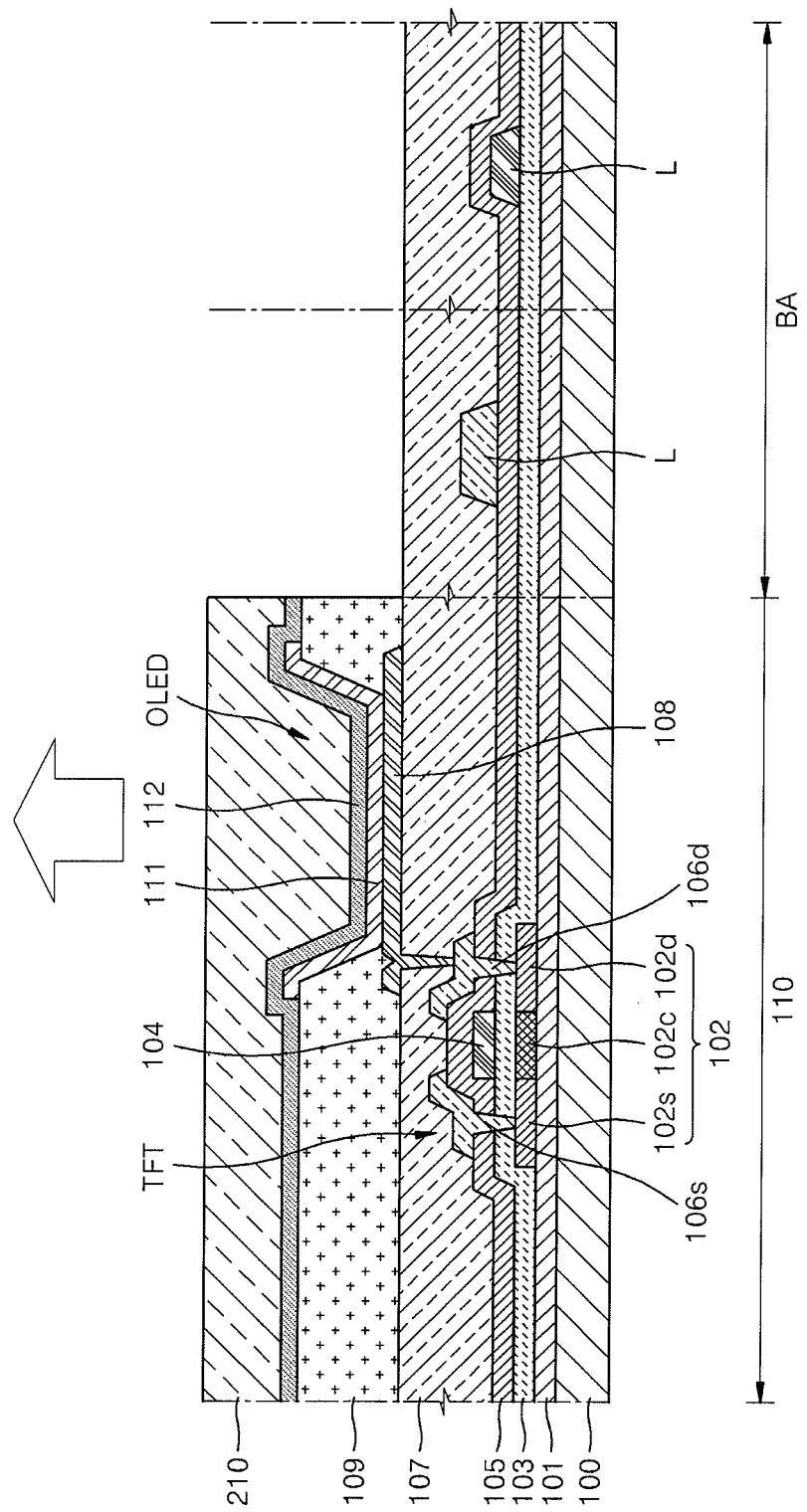
FIG. 4 is a cross-sectional view illustrating a cross-section of FIG. 3, taken along line IV-IV.
Figure 5:
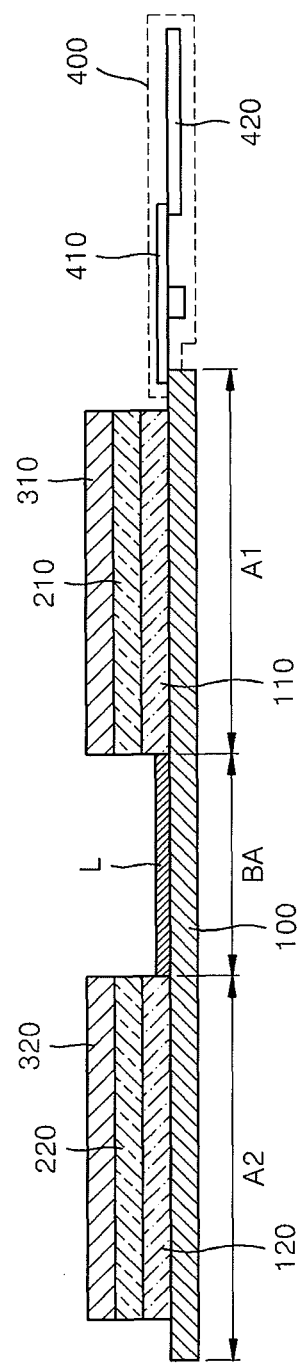
FIGS. 5 and 6 are cross-sectional views illustrating the method of manufacturing the dual-display device of FIG. 1.
Figure 6:
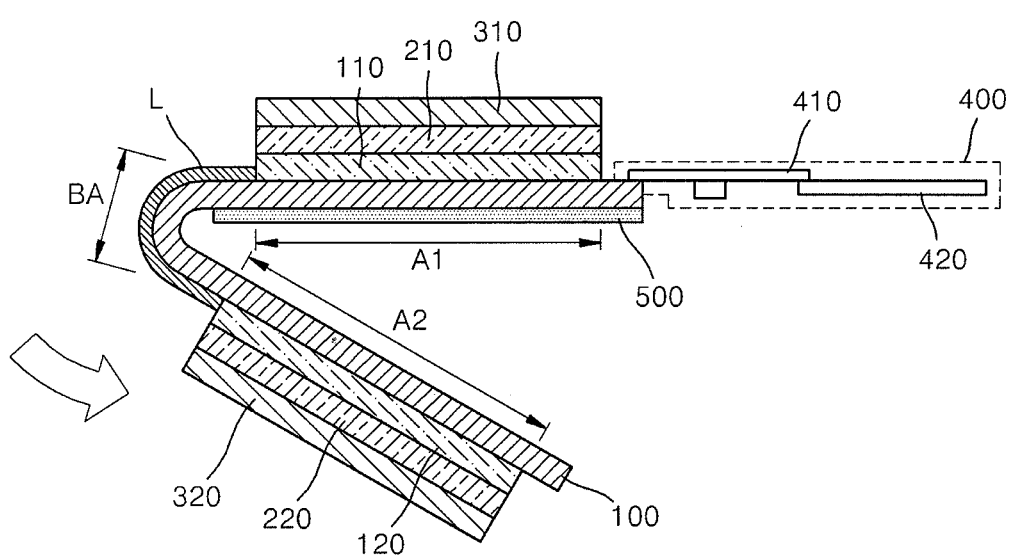

FIG. 3 is a plane view illustrating a method of manufacturing the dual-display device of FIG. 1, according to an embodiment of the present invention. FIG. 4 is a cross-sectional view illustrating a cross-section of FIG. 3, taken along line IV-IV. In addition to the method of FIG. 3, FIGS. 5 and 6 are cross-sectional views illustrating the method of manufacturing the dual-display device of FIG. 1. In the present embodiment, it is assumed that a first display unit 110 and a second display unit 120 are an active matrix type organic light-emitting display unit that has a pixel circuit unit including a thin-film transistor (TFT) for each of organic light-emitting devices OLEDs. However, aspects of the present invention are not limited thereto and thus the first display unit 110 and the second display unit 120 may be a passive matrix type organic light-emitting display unit.

Referring to FIGS. 3 and 4, first, a flexible substrate 100 is arranged. The flexible substrate 100 may be formed of a plastic material including polyethylene ether phthalate, polyethylene naphthalate (PEN), polycarbonate, polyetherimide, polyether sulfone, polyimide, or the like which have excellent heat-resistance and durability, but, aspects of the present invention are not limited thereto and thus various flexible materials may be used.

Next, an auxiliary layer 101 is completely formed on the flexible substrate 100. The auxiliary layer 101 functions to prevent diffusion of impurity ion on a top surface of the flexible substrate 100, to prevent penetration of moisture or external air, and to planarize the top surface of the flexible substrate 100. The auxiliary layer 101 may be formed as a single or composite layer including $SiO_2$ or $SiN_x$, by using various deposition methods.

Next, at least one TFT, a capacitor (not shown), and lines (L) are formed on the auxiliary layer 101. According to the present embodiment, various devices are simultaneously formed on the first display unit 110 and the second display unit 120. Also, the lines (L) that connect the first display unit 110 and the second display unit 120, and pad areas PA that extend from the first display unit 110 are formed at the same time.

The TFT includes an active layer 102 that is formed on the auxiliary layer 101, a gate electrode 104 that corresponds to a channel region of the active layer 102 by having a gate insulating layer 103 interposed therebetween, and source and drain electrodes 106s and 106d that insulate from the gate electrode 104 by having an interlayer insulating layer 105 interposed therebetween and that contact source and drain regions 102s and 102d of the active layer 102, respectively. The TFT shown in FIG. 4 is a driving TFT that is connected to the organic light-emitting device OLED and thus drives the organic light-emitting device OLED. Although not illustrated, various TFTs including a switching TFT that is turned on in response to a scan signal applied thereto, a switching TFT that is turned on in response to an emission control signal applied thereto, or the like may be formed on the first display unit 110 and the second display unit 120.

In FIG. 4, the TFT is a top gate type TFT. However, aspects of the present invention are not limited thereto, and thus the TFT may include various types of TFTs such as a bottom gate type TFT, or the like. Also, the number or types of the TFT are not limited thereto and thus may vary. Although not illustrated, the capacitor or the like may be formed when the TFT is formed.

Various lines L may be formed from the same material layer as the gate electrode 104 of the TFT. Also, various lines L may be formed from the same material layer as the source and drain electrodes 106s and 106d of the TFT. Here, the lines L indicate lines that transfer control signals including scan signals, emission control signals, various clock signals, or the like, and lines that transfer data signals to drive the first display unit 110 and the second display unit 120. However, details of signals that are transferred by the lines are not limited thereto. The lines L are directly connected to or are coupled to the TFT or the organic light-emitting device OLED. In the present embodiment, the lines L electrically connect the first display unit 110 and the second display unit 120, thereby transferring various signals of a common driving unit 400. When the lines L are formed, the pad areas PA may also be formed. Each of the pad areas PA is connected to the common driving unit 400 and thus receives various signals.

A passivation layer 107 is formed to cover the TFT and the lines L. The passivation layer 107 may be formed as a single or composite layer including an organic insulating material or an inorganic insulating material. The passivation layer 107 functions to protect the lines L against external elements, to planarize a top surface, and to allow the organic light-emitting device OLED formed thereon.

The organic light-emitting device OLED is formed on the passivation layer 107. The organic light-emitting device OLED is formed in order of a pixel electrode 108, an intermediate layer 111, and an opposite electrode 112. The present embodiment is a top-emission type display device in which an image is realized toward an encapsulation unit that faces the flexible substrate 100, so that the pixel electrode 108 is formed as a reflective electrode, and the opposite electrode 112 is formed as a transparent or transflective electrode.

The pixel electrode 108 may include the reflective electrode and may be thinly formed by using a metal material having a small work function, such as Ag, Mg, Al, Pt, Pd, Au, Ni, Nd, Ir, Cr, Li, Ca, LiF/Ca, LiF/Al, or compound of any of these. A pixel-defining layer (PDL) 109 that covers edges of the pixel electrode 108 and exposes a center portion of the pixel electrode 108 is further formed on the pixel electrode 108. The intermediate layer 111 is formed on the exposed center portion of the pixel electrode 108.

The intermediate layer 111 includes a common layer and an emission layer (EML). The common layer is commonly deposited and may have a structure in which a hole transport layer (HTL), a hole injection layer (HIL), an electron transport layer (ETL), an electron injection layer (EIL) or the like are singularly or multiply stacked. The EML emits light of a red color, a green color, or a blue color. The EML may be formed by using as a small molecule organic material or a polymer organic material. When the EML is formed of a small molecule organic material, an HTL and an HIL may be stacked below the EML toward the pixel electrode 108, and an ETL and an EIL may be stacked on the EML toward the opposite electrode 112. In addition to these layers, various layers may be stacked on or below the EML according to necessity. When the EML is formed of a polymer organic material, only an HTL may be stacked on the EML toward the pixel electrode 108. Since materials that are formed as the intermediate layer 111 are well known, detailed descriptions thereof are omitted here.

Afterward, the opposite electrode 112 may be commonly formed on top surfaces of the first display unit 110 and the second display unit 120 on which the intermediate layer 111 is formed. Here, the pixel electrode 108 may function as an anode electrode, and the opposite electrode 112 may function as a cathode electrode. Obviously, polarities of the pixel electrode 108 and the opposite electrode 112 may be switched.

A first encapsulation unit 210 and a second encapsulation unit 220 which are formed as TFE units to encapsulate the first display unit 110 and the second display unit 120, respectively, may be separately formed on the opposite electrode 112. Each of the TFE units has a structure in which an inorganic layer and an organic layer are alternately stacked. The inorganic layer may be formed of metal oxide, metal nitride, metal carbide, or a compound of any of these, and for example, the inorganic layer may include aluminum oxide, silicon oxide, or silicon nitride. The inorganic layer functions to prevent external moisture and oxygen from penetrating into the organic light-emitting device OLED. The organic layer may be a polymer organic compound and may include epoxy, acrylate, or urethane-acrylate. The organic layer may function to smooth an internal stress of the inorganic layer or to complement a defect of the inorganic layer and to planarize the inorganic layer.

The flexible substrate 100 includes a first area A1 and a second area A2. The first area A1 is an area in which the first display unit 110 is formed. The second area A2 is an area in which the second display unit 120 is formed. The first area A1 and the second area A2 are formed on the same surface, in the illustrated embodiment, the second surface of the flexible substrate 100, and a bending area BA is defined between the first area A1 and the second area A2. The bending area BA is an area where the flexible substrate 100 is bent. The first area A1 and the second area A2 include display areas DA, in each of which an image is realized, and the first display unit 110 and the second display unit 120 are formed, respectively, and non-display areas NDA that are disposed in outer regions of the display areas DA. In the non-display area NDA of the first area A1, a scan driver that is electrically connected to the first display unit 110 so as to apply a scan signal to the first display unit 110, an emission control driver that applies an emission control signal to the first display unit 110, or the like are disposed. Similarly, in the non-display area NDA of the second area A2, a scan driver that is electrically connected to the second display unit 120 so as to apply a scan signal to the second display unit 120, an emission control driver that applies an emission control signal to the second display unit 120, or the like are disposed.

As described above, the scan driver and the emission control driver of the first area A1, and the scan driver and the emission control driver of the second area A2 are electrically connected to each other via the lines L disposed over the bending area BA. In particular, a pad area PA is formed at an end of the line L extending from the scan driver and the emission control driver of the first area A1. The pad area PA is electrically connected to the common driving unit 400, and a control signal that is received from the common driving unit 400 via the pad area PA is transferred to the scan drivers and the emission control drivers of the first and second areas A1 and A2. In addition, a demux DeMUX to reduce the number of pads that are output terminals of the lines L may be disposed at a portion of the non-display area NDA of the first area A1 which is adjacent to the pad area PA.

In the above, processes of forming the encapsulated first display unit 110, the encapsulated second display unit 120, the various lines L, and the pad area PA on the flexible substrate 100 are described with reference to FIGS. 3 and 4.

Next, referring to FIG. 5, the pad area PA and the common driving unit 400 are connected. The common driving unit 400 includes a chip on film (COF) member 410 in which a driver integrated circuit (driver IC) including a data driving unit is integrally formed on a film, and a flexible printed circuit board (FPCB) member 420 including a power supplying unit, a control unit, and the like. The common driving unit 400 is bonded to the pad area PA by using an adhesive including conductive balls and thus is electrically connected to the pad area PA. However, a configuration of the common driving unit 400, and a method of bonding the common driving unit 400 and the pad area PA are not limited thereto and thus may vary.

Also, a first optical film 310 and a second optical film 320 are formed on the first encapsulation unit 210 and the second encapsulation unit 220, respectively. As described above, the first optical film 310 and the second optical film 320 may include polarizers to prevent reflection of external light, and in addition to the first optical film 310 and the second optical film 320, various optical films may be further attached to improve color reproduction and visibility.

The order of processes of manufacturing the dual-display device is not limited to the aforementioned descriptions. For example, a process of forming the optical film or a process of bonding the pad area PA and the common driving unit 400 may be simultaneously performed with a process of forming the TFE units or may be previously formed, compared to the process of forming the TFE units.

Next, referring to FIG. 6, the bending area BA of the flexible substrate 100 is bent to allow two areas of a first one of its major surfaces of the flexible substrate 100 to face each other, so that the dual-display device is formed. Here, an adhesive layer 500 is arranged on one of the two areas of the first surface of the flexible substrate 100, so that the two areas are bonded and the bent state of the flexible substrate 100 may be maintained.

In a comparative dual-display device having first and second panels separate from each other, the device is manufactured by adhering opposite surfaces, on which an image is not realized, of the first panel and the second panel that are separate from each other. Since such comparative dual-display device is manufactured by using the two separate first and second panels, it is difficult to reduce a thickness and a weight of the conventional dual-display device. Also, since such comparative dual-display device is manufactured via a process of arranging each of the first and second panels that independently have a driver IC and an FPCB, and a process of adhering or bonding the first and second panels, the manufacturing procedure is complicated, it is difficult to increase a yield rate of production, and the manufacturing costs are increased. Also, since the first panel and the second panel have to be evenly adhered, a TFT array substrate of each of the first and second panels is formed by using a rigid organic substrate or a rigid quartz substrate, so as to facilitate a process of adhering or bonding the first and second panels. Accordingly, such comparative dual-display device cannot be manufactured as a flexible display device, thus, it has a low usability.

However, the dual-display device according to the present embodiment is manufactured in a manner that the first display unit 110 and the second display unit 120 are formed on one flexible substrate 100, and then the flexible substrate 100 is bent to allow the first and second areas of the first surface to face each other. On the first surface, images are not realized. Thus, a thickness and a weight of the dual-display device may be reduced. Also, since the first display unit 110 and the second display unit 120, the lines L that connect the first display unit 110 and the second display unit 120, and the pad area PA are formed together at the same time, and the common driving unit 400 is used, the manufacturing procedure is simplified and the manufacturing costs are decreased. Also, since the flexible substrate 100, and the TFE units are used, the dual-display device may be used as a flexible display device.

Figure 7:
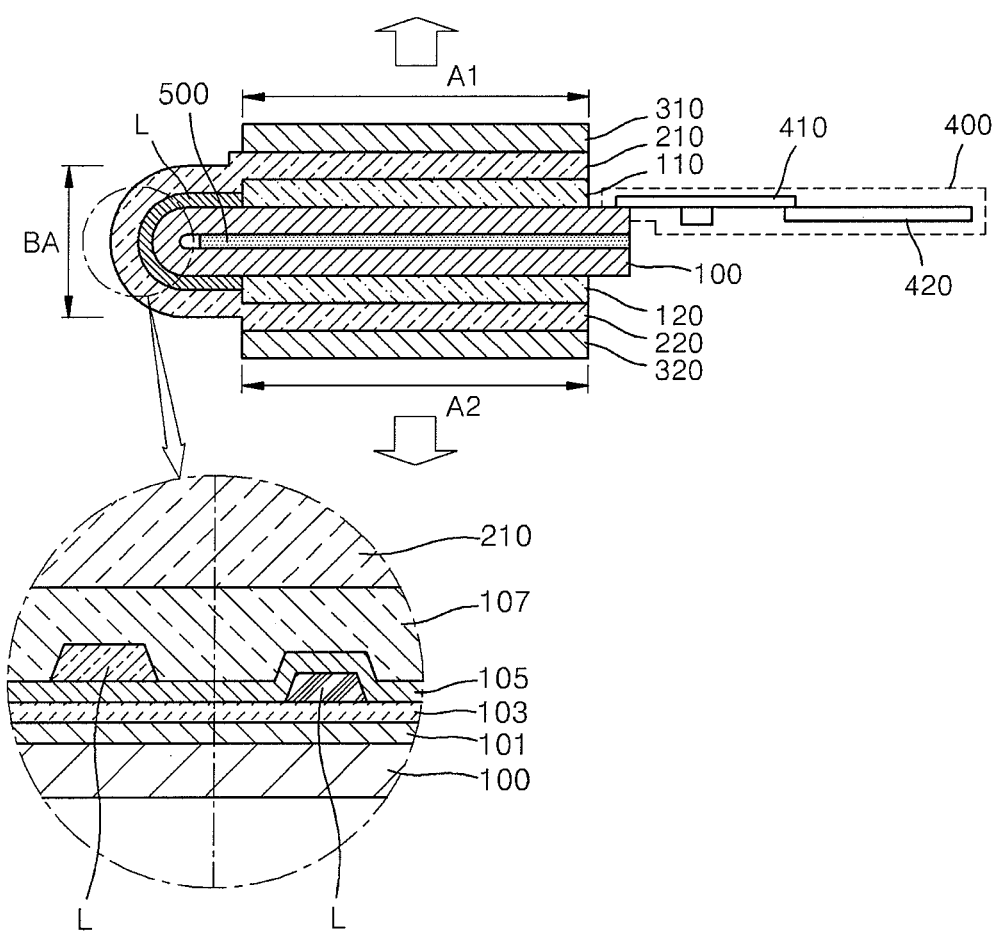
FIG. 7 is a cross-sectional view of a dual-display device and a bending area of the dual-display device, according to another embodiment of the present invention.

FIG. 7 is a cross-sectional view of a dual-display device and a bending area BA of the dual-display device, according to another embodiment of the present invention.

Referring to FIG. 7, the dual-display device according to the present embodiment is different from the previous embodiments in that a first encapsulation unit 210 extends to cover lines L that are formed in the bending area BA. Obviously, the present embodiment is not limited thereto and thus a second encapsulation unit 220 may cover the lines L that are formed in the bending area BA. Except for the aforementioned feature, like reference numerals in FIG. 7 denote like elements in FIGS. 1 and 2. Since the same elements have the same function or performance, hereinafter, detailed descriptions thereof are omitted.

The reason why the first encapsulation unit 210 or the second encapsulation unit 220 covers the lines L is to protect the lines L against external factors. In particular, the lines L in the bending area BA are likely to receive external collision or an external shock, so that it is required to arrange an additional protection member. The present embodiment does not require an additional process for the aforementioned feature since an end of the first encapsulation unit 210 or the second encapsulation unit 220 is simply extended to the bending area BA, when the first encapsulation unit 210 or the second encapsulation unit 220 is formed.

Figure 8:
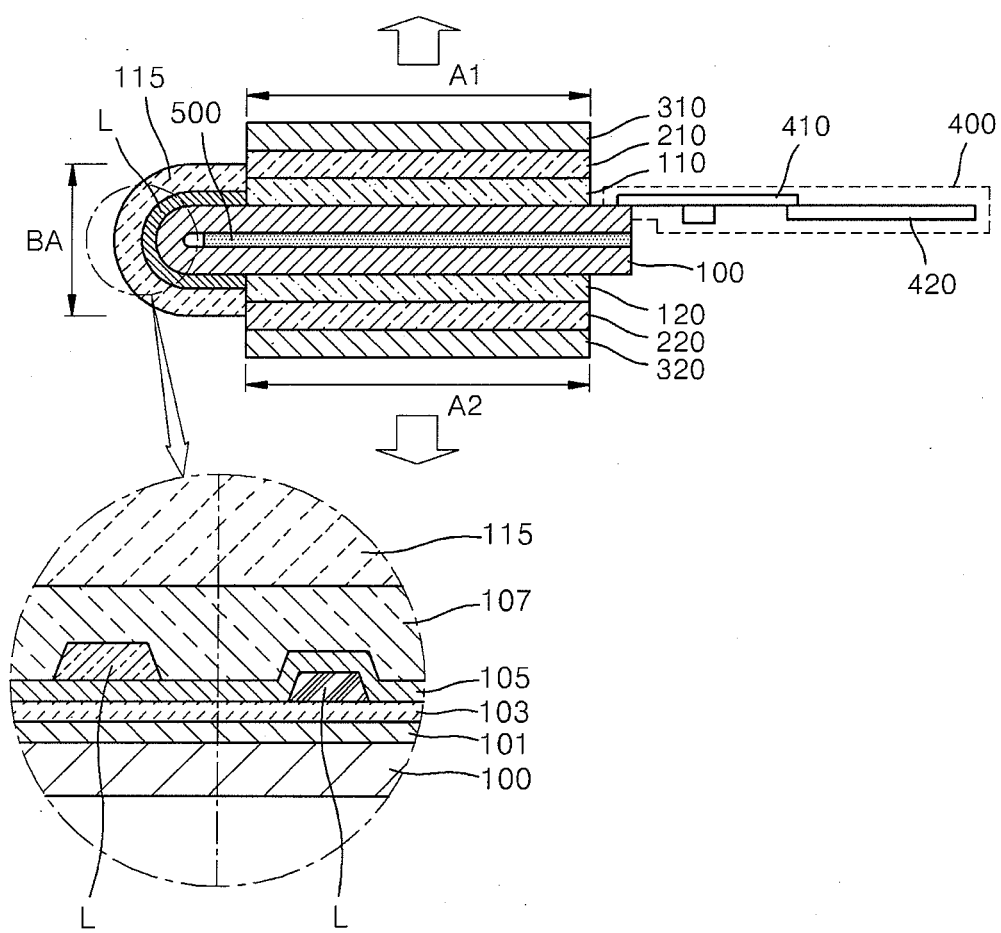
FIG. 8 is a cross-sectional view of a dual-display device and a bending area of the dual-display device, according to another embodiment of the present invention.

FIG. 8 is a cross-sectional view of a dual-display device and a bending area BA of the dual-display device, according to another embodiment of the present invention.

Referring to FIG. 8, the dual-display device according to the present embodiment is different from the previous embodiments in that a protective layer is separately formed to cover lines L that are formed in the bending area BA. Except for the aforementioned feature, like reference numerals in FIG. 8 denote like elements in FIGS. 1 and 2. Since the same elements have the same function or performance, hereinafter, detailed descriptions thereof are omitted.

The reason why the protective layer covers the lines L is to protect the lines L against external factors. In particular, the lines L in the bending area BA are likely to receive external collision or an external shock, so that it is required to arrange an additional protection member. The present embodiment may be formed in a manner that a passivation layer 107 is formed on the lines L, and then a separate protective layer 115 is formed on the passivation layer 107 by using a deposition method or a screen spray method. The protective layer 115 may be formed as a single or composite layer including an inorganic insulating material or an organic insulating material. For example, the protective layer 115 may be formed of polyimide (PI).

Figure 9:
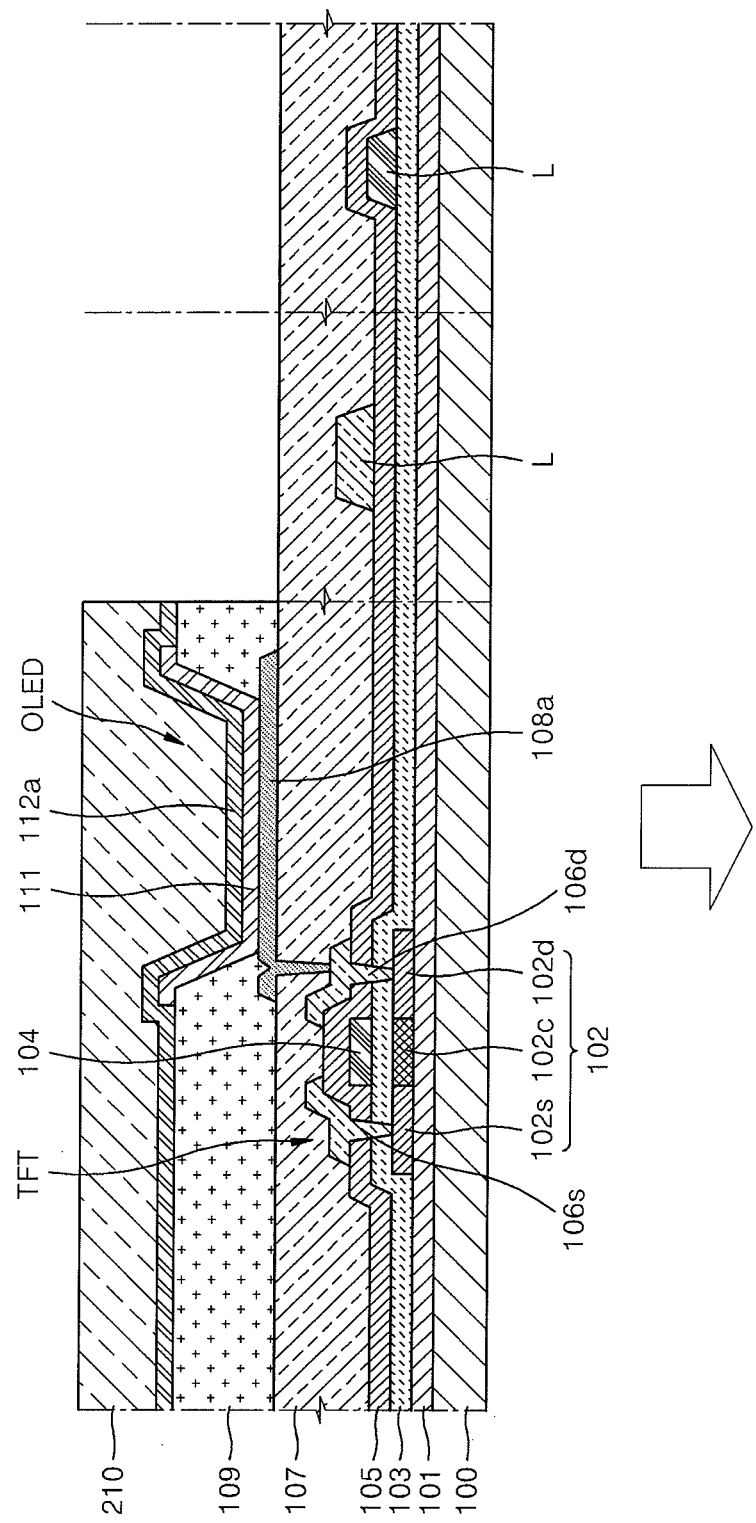
FIG. 9 is a cross-sectional view of a dual-display device, according to another embodiment of the present invention.

FIG. 9 is a cross-sectional view of a dual-display device, according to another embodiment of the present invention.

Referring to FIG. 9, the dual-display device according to the present embodiment is different from the previous embodiments in that the dual-display device according to the present embodiment is a bottom emission type dual-display device in which a first display unit 110 and a second display unit 120 realize an image toward a flexible substrate 100. Thus, the flexible substrate 100 is bent in a different direction from the previous embodiments. Except for the aforementioned feature, like reference numerals in FIG. 9 denote like elements in FIGS. 1 and 2. Since the same elements have the same function or performance, hereinafter, detailed descriptions thereof are omitted.

Referring to FIG. 9, since an image is realized toward the flexible substrate 100, the flexible substrate 100 has to be formed of a transparent material. Also, since the dual-display device according to the present embodiment is the bottom emission type dual-display device, a pixel electrode 108 is formed as a transmissive electrode, and an opposite electrode 112 is formed as a reflective electrode. In more detail, the pixel electrode 108 is formed of a transparent film including ITO, IZO, ZnO, or $In_2O_3$, which has a high work function. The opposite electrode 112 may be formed of Li, Ca, LiF/Ca, LiF/Al, Al, Mg, or Ag, which has a low work function.

Figure 10:
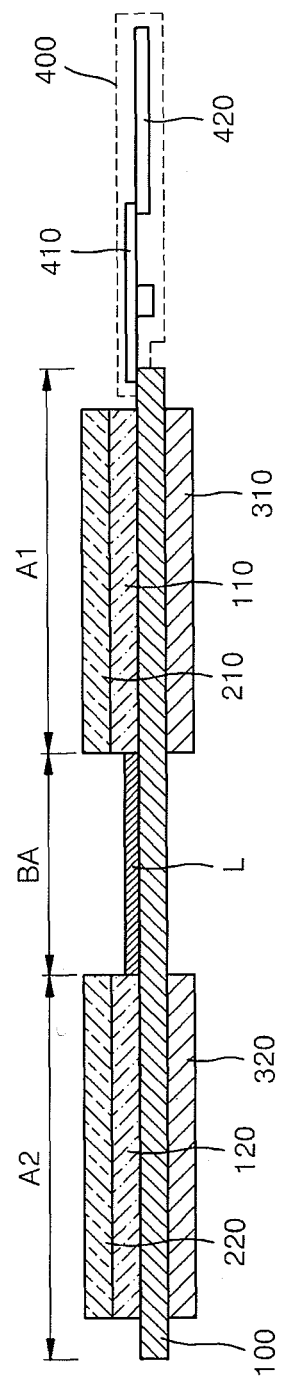
FIGS. 10 and 11 are cross-sectional views of a method of manufacturing the dual-display device of FIG. 9, according to an embodiment of the present invention.
Figure 11:
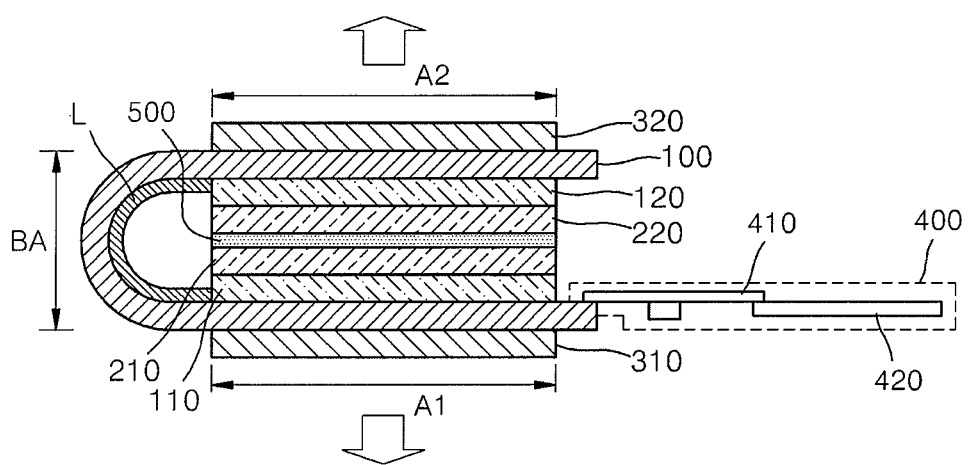

FIGS. 10 and 11 are cross-sectional views of a method of manufacturing the dual-display device of FIG. 9, according to an embodiment of the present invention.

First, similar to the descriptions with reference to FIGS. 3 and 4, in a manufacturing procedure before FIG. 10, the method of manufacturing the dual-display device according to the present embodiment may include forming an auxiliary layer 101 on a flexible substrate 100, forming a first display unit 110 and a second display unit 120a in a first area A1 and a second area A2 of a first one of major surfaces of the substrate, respectively, forming lines L in a bending area BA, and forming a pad area PA at an end of the first area A1 at the same time. Also, the first display unit 110 and the second display unit 120 are encapsulated by using a first encapsulation unit 210 and a second encapsulation unit 220, respectively. Although not illustrated, similar to the embodiment of FIG. 3, various drivers may be formed in the first area A1 and the second area A2.

Next, referring to FIG. 10, a first optical film 310 and a second optical film 320 are formed on a second one of the major surfaces of the flexible substrate 100. In more detail, since the first display unit 110 and the second display unit 120 are a bottom emission type, the first optical film 310 is formed on a portion of the second surface of the flexible substrate 100 which corresponds to the first display unit 110, and the second optical film 320 is formed on a portion of the second surface of the flexible substrate 100 which corresponds to the second display unit 120. The first optical film 310 and the second optical film 320 may include polarizers that prevent that external light is reflected toward a user due to electrodes of the flexible substrate 100 or the first and second display units 110 and 120, such that a contrast deteriorates. However, in addition to the first optical film 310 and the second optical film 320, various optical films may be further attached to improve color reproduction and visibility.

Referring to FIG. 11, the bending area BA of the flexible substrate 100 is bent to allow the first encapsulation unit 210 and the second encapsulation unit 220 formed on the first display unit 110 and the second display unit 120, respectively. Here, an adhesive 500 is arranged on surfaces of the first encapsulation unit 210 and the second encapsulation unit 220 which face each other, so that the bent or folded state of the flexible substrate 100 may be fixed. Since FIG. 11 illustrates the embodiment of a bottom emission type dual-display device, it is possible to see that a bent direction of the flexible substrate 100 in the present embodiment is opposite to a bent direction of the previous embodiments including the top emission type dual-display devices.

According to the dual-display device and the method of manufacturing the same, the dual-display device is formed by bending or folding the flexible substrate, and one driver IC and one FPCB are used, so that the dual-display device may be manufactured via a simple manufacturing procedure.

Also, since the dual-display device is manufactured by using one flexible substrate, instead of using two rigid substrates, the dual-display device may have a slim thickness and flexibility.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A dual-display device comprising:
a flexible substrate comprising a first section, a curved section and a second section that are arranged in order and made of a single material, wherein the first, curved and second sections are defined between an outer surface and an inner surface such that the outer surface comprises a first outer planar portion, a second outer planar portion and a curved outer portion continuously interconnecting the first and second outer planar portions and further such that the first outer planar portion facing away from the second outer planar portion, the inner surface comprising a first inner planar portion, a second inner planar portion and a curved inner portion continuously interconnecting the first and second inner planar portions;
a first display unit configured to realize a first image, the first display in its entirety formed over the single material first section of the flexible substrate and the first outer planar portion of the outer surface of the flexible substrate, and including an organic light-emitting device (OLED);
a second display unit electrically connected to the first display unit via lines and configured to realize a second image, the second display in its entirety formed over the single material second section of the flexible substrate and the second outer planar portion of the outer surface of the flexible substrate, and including an organic light-emitting device (OLED);
a common driver unit electrically connected to a pad area that extends from the first display unit, and configured to transmit at least a signal to drive the first display unit and the second display unit; and
an adhesive layer directly disposed between the first and second inner planar portions of the inner surface of the flexible substrate,
wherein the adhesive layer is interposed between the first and the second sections of the flexible substrate, and wherein the first and the second sections of the flexible substrate are interposed between the first display unit and the second display unit.

2. The dual-display device of claim 1, wherein the first and second display units are connected by lines disposed over the curved outer portion of the outer surface.

3. The dual-display device of claim 2, further comprising:
a protective layer formed over the lines.

4. The dual-display device of claim 2,
wherein the first display unit is formed over the first outer planar portion and the second display unit is formed over the second outer planar portion,
wherein the dual-display device further comprises a first driver disposed over the first outer planar portion of the outer surface, electrically connected to the first display unit, and configured to transmit at least a signal to drive the first display unit; and a second driver disposed over the second outer planar portion of the outer surface, electrically connected to the second display unit, and configured to transmit at least a signal to drive the second display unit,
wherein the first driver and the second driver are electrically connected to each other via the lines that are disposed over the curved outer portion of the outer surface.

5. The dual-display device of claim 2, further comprising:
a first encapsulation unit disposed over the first display unit, and configured to encapsulate the first display unit; and
a second encapsulation unit disposed over the second display unit, and configured to encapsulate the second display unit.

6. The dual-display device of claim 5, wherein the first encapsulation unit or the second encapsulation unit extends over the curved outer portion so as to cover the lines.

7. The dual-display device of claim 5, further comprising:
a first optical film disposed over the first encapsulation unit; and
a second optical film disposed over the second encapsulation unit.

8. The dual-display device of claim 1, wherein each of the first display unit and the second display unit comprises at least one thin-film transistor (TFT) and an organic light-emitting device coupled to the at least one TFT, and
wherein the lines are coupled to the at least one TFT or the organic light-emitting device.

9. The dual-display device of claim 1, wherein each of the first display unit and the second display unit is configured to realize an image in a direction away from the flexible substrate.

10. A dual-display device comprising:
flexible substrate comprising a first section, a curved section and a second section that are arranged in order and made of a single material, wherein the first, curved and second sections are defined between a outer surface and a inner surface such that the outer surface comprises a first outer planar portion, a second outer planar portion and a curved outer portion continuously interconnecting the first and second outer planar portions and further such that the first outer planar portion facing away from the second outer planar portion, the inner surface comprising a first inner planar portion, a second inner planar portion and a curved inner portion continuously interconnecting the first and second inner planar portions;
a first display unit configured to realize a first image, the first display in its entirety formed over the single material first section of the flexible substrate and the first inner planar portion of the continuous inner surface of the flexible substrate, and including an organic light-emitting device (OLED);

a first encapsulation unit disposed over the first display unit, and configured to encapsulate the first display unit;

a second display unit configured to realize a second image, the second display in its entirety formed over the single material second section of the flexible substrate and the second inner planar portion of the continuous inner surface of the flexible substrate and including an organic light-emitting device (OLED);

a second encapsulation unit disposed over the second display unit, and configured to encapsulate the second display unit;

a common driver unit electrically connected to a pad area that extends from the first display unit, and configured to transmit at least a signal to drive the first display unit and the second display unit;

an adhesive layer directly disposed between the first and second encapsulation units, wherein the adhesive layer is interposed between the first and the second encapsulation units, and wherein the first and the second display units are interposed between the first and the second sections of the flexible substrate.

11. The dual-display device of claim 10, wherein the first and second display units are connected by lines disposed in the curved inner portion of the continuous inner surface.

12. The dual-display device of claim 11, further comprising:
a first driver disposed over the first inner planar portion of the continuous inner surface, electrically connected to the first display unit, and configured to transmit at least a signal to drive the first display unit; and
a second driver disposed over the second inner planar portion of the continuous inner surface, electrically connected to the second display unit, and configured to transmit at least a signal to drive the second display unit,
wherein the first and second drivers are electrically connected to each other via the lines that are disposed over the curved inner portion of the continuous inner surface.

13. The dual-display device of claim 10, further comprising an adhesive layer disposed between the first and second inner planar portions of the continuous inner surface and adhering the first and second inner planar portions.

14. The dual-display device of claim 10, further comprising:
a first optical film disposed over the first outer planar portion of the continuous outer surface; and
a second optical film disposed over the second outer planar portion of the continuous outer surface.

15. The dual-display device of claim 10, wherein each of the first display unit and the second display unit comprises at least one thin-film transistor (TFT) and an organic light-emitting device coupled to the at least one TFT, and
wherein the lines are coupled to the at least one TFT or the organic light-emitting device.

16. The dual-display device of claim 10, wherein the first outer planar portion is substantially parallel to the second outer planar portion.

17. A method of manufacturing a dual-display device, the method comprising:
providing a flexible substrate made of a single material and comprising first and second surfaces facing away from each other, the first surface comprising a first area and a second area, the second surface comprising first and second areas corresponding to the first and second areas of the first surface, respectively;

forming a first display unit including an organic light-emitting device (OLED) over the first area of the second surface of the flexible substrate, a second display unit including an organic light-emitting device (OLED) over the second area of the second surface, and lines in a third area of the second surface between the first and second areas of the second surface;

forming a first encapsulation unit over the first display unit and a second encapsulation unit over the second display unit; and bending the flexible substrate to form a U-shape substrate comprising a first section, a curved section and a second section that are arranged in order and defined between a continuous inner surface and a continuous outer surface, wherein the first surface of the flexible substrate forms the continuous inner surface of the U-shape substrate, wherein the second surface of the flexible substrate forms the continuous outer surface of the U-shape substrate, wherein the first and second areas of the first surface of the flexible substrate respectively form a first inner planar portion and a second inner planar portion of the continuous inner surface, wherein the first, second, third areas of the second surface respectively form a first outer planar portion, a second outer planar portion and a curved outer portion interconnecting the first and second outer planar portions of the continuous outer surface, wherein the first display in its entirety formed over the single material first section of the U-shape substrate and the first outer planar portion of the continuous outer surface of the U-shape substrate, wherein the second display in its entirety formed over the single material second section of the U-shape substrate and the second outer planar portion of the continuous outer surface of the U-shape substrate;

forming an adhesive layer directly disposed between the first and second inner planar portions of the inner surface of the flexible substrate, wherein the adhesive layer is interposed between the first and the second sections of the flexible substrate, and wherein the first and the second sections of the flexible substrate are interposed between the first display unit and the second display unit; and bonding at least part of the first and second inner planar portions of the continuous inner surface with a bonding material to produce the dual-display device.

18. The method of claim 17, further comprising, after forming the lines, forming a protective layer over the third area so as to cover the lines.

19. The method of claim 17, wherein, in the forming of the first and second encapsulation units, the first encapsulation unit or the second display unit extends over the third area so as to cover the lines.

20. The method of claim 17, further comprising, after forming the first and second encapsulation units, forming a first optical film over the first encapsulation unit and forming a second optical film over the second encapsulation unit.

21. A method of manufacturing a dual-display device, the method comprising:
providing a flexible substrate made of a single material and comprising first and second surfaces facing away from each other, the first surface comprising a first area and a second area, the second surface comprising first and second areas corresponding to the first and second areas of the first surface, respectively;

forming a first display unit including an organic light-emitting device (OLED) over the first area of the second surface of the flexible substrate, a second display unit including an organic light-emitting device (OLED) over the second area of the second surface, and lines in a third area of the second surface between the first and second areas of the second surface;

forming a first encapsulation unit over the first display unit and a second encapsulation unit over the second display unit; and bending the flexible substrate to form a U-shape substrate comprising a first section, a curved section and a second section that are arranged in order and defined between a continuous inner surface and a continuous outer surface, wherein the first surface of the flexible substrate forms the continuous outer surface of the U-shape substrate, wherein the second surface of the flexible substrate forms the continuous inner surface of the U-shape substrate, wherein the first and second areas of the first surface of the flexible substrate respectively form a first outer planar portion and a second outer planar portion of the continuous outer surface, wherein the first, second, third areas of the second surface respectively form a first inner planar portion, a second inner planar portion and a curved inner portion interconnecting the first and second inner planar portions of the continuous inner surface, wherein the first display in its entirety formed over the single material first section of the U-shape substrate and the first inner planar portion of the continuous inner surface of the U-shape substrate, wherein the second display in its entirety formed over the single material second section of the U-shape substrate and the second inner planar portion of the continuous inner surface of the U-shape substrate;

forming an adhesive layer directly disposed between the first and second inner planar portions of the inner surface of the flexible substrate, wherein the adhesive layer is interposed between the first and the second sections of the flexible substrate, and wherein the first and the second sections of the flexible substrate are interposed between the first display unit and the second display unit; and bonding at least part of the first encapsulation unit to the second encapsulation unit with a bonding material to produce the dual-display device.

22. The method of claim 21, further comprising, after forming the first and second encapsulation units, forming a first optical film over the first area of the first surface of the flexible substrate, and forming a second optical film over the second area of the first surface of the flexible substrate.

* * * * *